(12) United States Patent
Bratkovski et al.

(10) Patent No.: US 8,687,983 B2
(45) Date of Patent: Apr. 1, 2014

(54) LASER COMMUNICATION SYSTEM

(75) Inventors: Alexandre M Bratkovski, Mountain View, CA (US); Jacob Khurgin, Baltimore, MD (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 126 days.

(21) Appl. No.: 13/287,555

(22) Filed: Nov. 2, 2011

(65) Prior Publication Data
US 2013/0108279 A1    May 2, 2013

(51) Int. Cl.
*H04B 10/04*    (2011.01)
(52) U.S. Cl.
USPC .............................. 398/212; 398/202; 398/79
(58) Field of Classification Search
None
See application file for complete search history.

(56) References Cited

U.S. PATENT DOCUMENTS

| 5,099,351 | A  | * | 3/1992  | O'Byrne ........................ 398/204 |
| 5,574,738 | A  |   | 11/1996 | Morgan |
| 7,295,589 | B2 |   | 11/2007 | Peters et al. |
| 7,333,735 | B1 |   | 2/2008  | Gourjian |
| 7,526,209 | B2 |   | 4/2009  | Kawanishi et al. |
| 7,650,081 | B2 | * | 1/2010  | Jennen et al. ................. 398/186 |
| 7,801,197 | B2 |   | 9/2010  | Konttinen |

FOREIGN PATENT DOCUMENTS

| EP | 1944842    | 7/2008 |
| JP | 2006332390 | 12/2006 |

* cited by examiner

*Primary Examiner* — Shi K Li
*Assistant Examiner* — Merlin Brito Peguero

(57) ABSTRACT

A laser communication system and method are disclosed. The laser communication system includes a laser receiver system to receive a frequency-shift keyed (FSK) optical signal encoded with a plurality of data signals. The laser receiver system including an FSK differential detection system that includes a plurality of differential detection filters that can each receive the FSK optical signal and generate an output. The FSK differential detection system can demodulate the FSK optical signal into a multi-bit digital code corresponding to a frequency of the FSK optical signal based on the output of each of the plurality of differential detection filters.

16 Claims, 4 Drawing Sheets

LASER COMMUNICATION SYSTEM

BACKGROUND

Optical systems are becoming more prevalent in modern communications systems as the demand for high-speed and high-efficiency communications increases. Optical systems can employ lasers to generate optical signals. The speed at which lasers can be modulated can depend on a number of factors, such as differential gain and/or resonator cavity length, and can typically achieve very high bit rates (e.g., 40 Gbps). However, electronic processing devices can typically be much more limited in bit rate, such that the bandwidth of optical communications systems can often be limited by the relative slower electronic processing devices.

DETAILED DESCRIPTION

Figure 1:
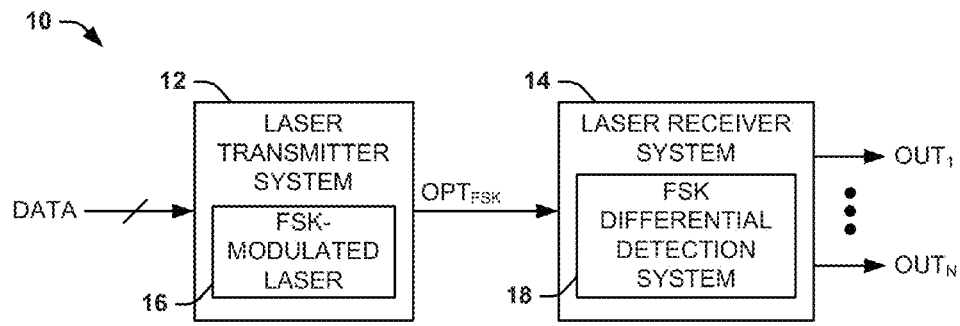
FIG. 1 illustrates an example diagram of a laser communication system.

FIG. 1 illustrates an example diagram of a laser communication system 10. The laser system 10 can be employed in any of a variety of optical systems, such as in optical communications and optical interconnect systems. The laser communication system includes a laser transmitter system 12 and a laser receiver system 14. The laser transmitter system 12 is configured to receive a data signal DATA that can include, for example, a plurality of digital data streams. As an example, the data signal DATA can be configured as a multi-bit digital code that has been multiplexed from a plurality of separate digital data streams. The laser transmitter system 12 is configured to modulate the data signal DATA into a frequency-shift keyed (FSK) optical signal $OPT_{FSK}$. The laser receiver system 14 is configured to receive the FSK optical signal $OPT_{FSK}$ and to demodulate the FSK optical signal $OPT_{FSK}$ into a plurality N of digital output signals $OUT_1$ through $OUT_N$, where N is a positive integer greater than one. As an example, the digital output signals $OUT_1$ through $OUT_N$ can each be associated with the separate digital data streams associated with the data signal DATA.

In the example of FIG. 1, the laser transmitter system 12 includes an FSK-modulated laser 16. As an example, the FSK-modulated laser 16 can be configured as a vertical-cavity surface-emitting laser (VCSEL). The FSK-modulated laser 16 can thus be modulated, such as via a modulation voltage, to generate the optical signal $OPT_{FSK}$ at a frequency that is associated with a given multi-bit digital code corresponding to the data signal DATA, such as to achieve a very high bit-rate (e.g., 40 Gbps).

In addition, in the example of FIG. 1, the laser receiver system 14 includes an FSK differential detection system 18. As an example, the differential detection system 18 can include a plurality of differential detection filters that are each configured to receive the FSK optical signal $OPT_{FSK}$, such as via an optical fiber (e.g., a single mode fiber) and to resonate the FSK optical signal $OPT_{FSK}$ in a resonator cavity having a unique resonator cavity length. Therefore, each of the differential detection filters can be tuned to a different frequency associated with the FSK optical signal $OPT_{FSK}$. As a result, the differential detection filters can each generate a current that is associated with the intensity of the FSK optical signal $OPT_{FSK}$ relative to the unique resonator cavity length. Accordingly, the laser receiver system 14 can be configured to determine the frequency of the FSK optical signal $OPT_{FSK}$ based on a mathematical relationship between the currents, such that the laser receiver system 14 can determine the multi-bit digital code encoded in the FSK optical signal $OPT_{FSK}$ based on the frequency.

Figure 2:
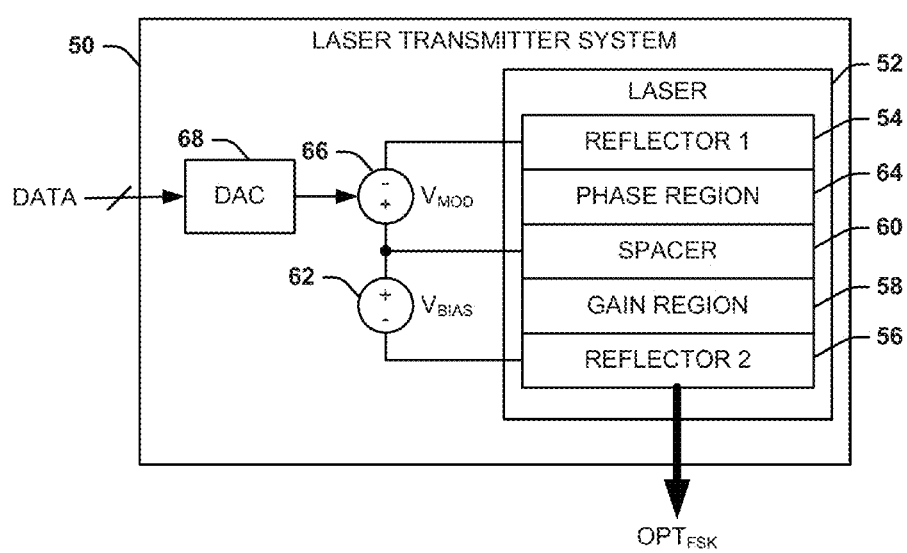
FIG. 2 illustrates an example of a laser transmitter system.

FIG. 2 illustrates an example of a laser transmitter system 50. The laser transmitter system 50 can correspond to the laser transmitter system 12 in the example of FIG. 1. Therefore, reference is to be made to the example of FIG. 1 in the following description of the example of FIG. 2.

The laser transmitter system 50 includes a laser 52. The laser 52 can be configured, for example, as a VCSEL, and can generate the FSK optical signal $OPT_{FSK}$. The laser 52 includes a first reflector portion 54 and a second reflector portion 56. As an example, the first and second reflector portions 54 and 56 can each be configured as distributed Bragg reflectors, such as including alternating layers of materials having different refractive indices. The second reflector portion 56 can be less reflective than the first reflector portion 54, such as to emit the FSK optical signal $OPT_{FSK}$. The FSK optical signal $OPT_{FSK}$ can thus resonate within the laser 54.

The laser 52 also includes a gain region 58 and a spacer 60. As an example, the spacer 60 can be doped with a polarity opposite a doping associated with the first and second reflector portions 54 and 56. The gain region 58 is configured to generate the FSK optical signal $OPT_{FSK}$ in response to a bias voltage $V_{BIAS}$ that is generated by a voltage source 62 arranged between the spacer 60 and the second reflector portion 56. Thus, the gain region 58 can be biased to emit photons to generate the FSK optical signal $OPT_{FSK}$. Furthermore, the laser 52 can include a phase region 64 that interconnects the spacer 60 and the first reflector portion 54. The phase region 64 can be biased by a modulation voltage $V_{MOD}$ that is generated by a variable voltage source 66. The modulation voltage $V_{MOD}$ can be adjusted to change the refractive index of the phase region 62. As a result, by changing the refractive index of the phase region 62 via the modulation voltage $V_{MOD}$, the frequency of the FSK optical signal $OPT_{FSK}$ can be adjusted.

The laser transmitter system 50 can also include a digital-to-analog converter (DAC) 68 that is configured to convert the digital data signal DATA to an analog value. The analog value output from the DAC 68 is provided to the variable voltage source 66, such that the variable voltage source 66 generates the modulation voltage $V_{MOD}$ at a magnitude that is associated with the data signal DATA. Therefore, the magnitude of the modulation voltage $V_{MOD}$ can change the refractive index of the phase region 64 in a manner to modulate the frequency of the FSK optical signal $OPT_{FSK}$ to a frequency that is specific to the digital value of the data signal DATA. Accordingly, the FSK optical signal $OPT_{FSK}$ can be modulated based on the multi-bit digital code corresponding to the data signal DATA.

As an example, the data signal DATA can be a multi-bit digital data signal, such as multiplexed from a plurality of single-bit data streams. As one example, the number of single-bit data streams can be equal to four, such that the frequency of the FSK optical signal $OPT_{FSK}$ can be indicative of four bits of data. The laser 52 can be rapidly modulated based on the configuration of the gain and phase regions 58 and 64, such that the laser 52 can rapidly change the frequency of the FSK optical signal $OPT_{FSK}$ for each successive multi-bit digital code associated with each of the plurality of single-bit data streams. Accordingly, the FSK optical signal $OPT_{FSK}$ can have an associated data rate that is multiple times greater (e.g., four times greater) than a data rate associated with each of the plurality of single-bit data streams to efficiently communicate data.

Figure 3:
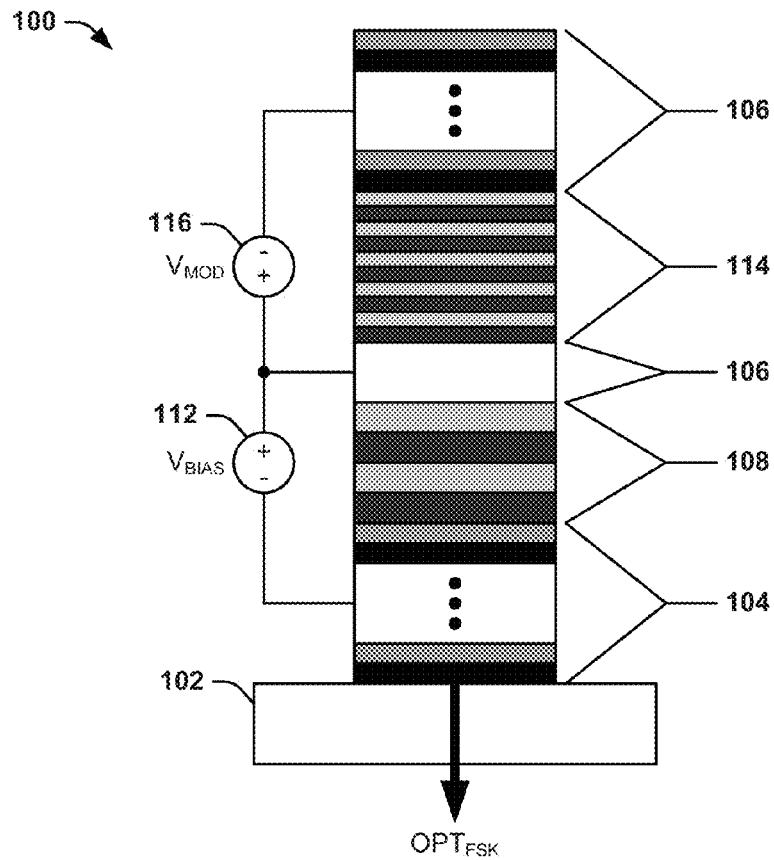
FIG. 3 illustrates an example diagram of a laser.

FIG. 3 illustrates an example diagram of a laser 100. The laser 100 can correspond to the FSK-modulated laser 16 in the example of FIG. 1 and the laser 52 in the example of FIG. 2. Therefore, reference is to be made to the examples of FIGS. 1 and 2 in the following description of the example of FIG. 3. As described above, for example, the laser 100 can be configured as a VCSEL.

The laser 100 includes a substrate 102 on which the laser 100 can be fabricated. For example, the substrate 102 can be configured as a semiconductor material, such as gallium-arsenide (GaAs). The laser 100 also includes a first reflector portion 104 and a second reflector portion 106. In the example of FIG. 3, the first and second reflector portions 104 and 106 are each configured as distributed Bragg reflectors having alternating material layers. The alternating material layers of the first and second reflectors 104 and 106 can be fabricated on the laser 100 in any of a variety of ways, such as molecular beam epitaxy (MBE) or metal-organic chemical vapor deposition (MOCVD).

For example, the first and second reflector portions 104 and 106 can include alternating layers of N-doped aluminum-gallium-arsenide (AlGaAs) in respective ratios of $Al_{0.9}Ga_{0.1}As$ and $Al_{0.1}Ga_{0.9}As$, with each layer having a thickness that is approximately one quarter of nominal wavelength (e.g., 980 nm). As an example, the first reflector portion 104 can have between ten and fifteen pairs of alternating layers, while the second reflector portion 106 can have twenty or more pairs of alternating layers. As a result, the second reflector portion 106 can be approximately 99.9% reflective, while the first reflector portion 104 can be semi-transparent. Accordingly, the first and second reflector portions 104 and 106 can define a Fabry-Perot resonating cavity, such that the FSK optical signal $OPT_{FSK}$ can resonate within the laser 100 and can be emitted via the first reflector portion 104.

The laser 100 also includes a gain region 108 and a spacer 110. As an example, the spacer 110 can be a P-doped semiconductor material. As another example, the gain region 108 can include a plurality of quantum wells, such as two or three, that are separated by a similar plurality of strain-balancing barrier layers. The quantum wells can include, for example, indium-gallium-arsenide (e.g., in a ratio of $In_{0.25}Ga_{0.75}As$) and the strain-balancing barrier layers can include, for example, gallium-arsenide-phosphide (e.g., in a ratio of $GaAs_{0.9}P_{0.1}$). The gain region 108 can thus be configured to generate the FSK optical signal $OPT_{FSK}$ in response to the bias voltage $V_{BIAS}$. In the example of FIG. 3, a voltage source 112 is coupled to the spacer 110 and the first reflector 104 to provide the bias voltage $V_{BIAS}$ to forward bias the gain region 108. Therefore, the gain region 108 emits photons in response to the combination of electrical carriers from the first reflector 104 and the spacer 110 to generate the FSK optical signal $OPT_{FSK}$ at a given wavelength.

The laser 100 further includes a phase region 114. The phase region 114 can have a composition that is similar to the gain region 108, such as including alternating layers of $In_{0.25}Ga_{0.75}As$ and $GaAs_{0.9}P_{0.1}$. However, the thickness of the alternating layers in the phase region 114 can each be thinner relative to the respective layers of the in the gain region 108. As a result, the phase region 114 can have a wider effective bandgap than the gain region and can be nominally transparent at a given oscillation frequency of the FSK optical signal $OPT_{FSK}$. In addition, the number of alternating layers in the phase region 114 can be greater than the number of alternating layers in the gain region 108, such that the phase region 114 can be overall significantly thicker than the gain region 108.

In the example of FIG. 3, the phase region 114 is biased by the modulation voltage $V_{MOD}$. The modulation voltage $V_{MOD}$ is generated by a variable voltage source 116 that is coupled to the spacer 110 and the second reflector 106 to reverse bias the phase region 114. As described above in the example of FIG. 2, the modulation voltage $V_{MOD}$ can be adjusted to change the refractive index of the phase region 114. As a result, by changing the refractive index of the phase region 62 via the modulation voltage $V_{MOD}$, the frequency of the FSK optical signal $OPT_{FSK}$ can be adjusted. In addition, because the phase region 114 can be significantly thicker than the gain region 108, the fraction of the effective resonating cavity length of the laser 100 that is occupied by the phase region 114 can be substantially maximized to provide more efficient modulation of the FSK optical signal $OPT_{FSK}$.

Based on the configuration of the laser 100, a multi-bit digital code can thus be transmitted as the FSK optical signal $OPT_{FSK}$. For example, the multi-bit digital code can be digitally synthesized via the DAC 68 in the example of FIG. 2 and applied as the variable modulation voltage $V_{MOD}$ to reverse bias the phase region 114. A change in the reverse bias $dV(t)$ of the phase region 114 can thus change the refractive index $\delta n = A \cdot n \cdot dV(t)$ of the phase region 114 via a Quantum Confined Stark Effect, such as characterized by a coefficient $A \approx 0.0005$-$0.001\ V^{-1}$. As a result, when the refractive index of the phase region 114 is changed, the resonant frequency of the Fabry-Perot resonating cavity of the laser changes, which is defined as follows:

$$\delta f(t) \sim F f_0 \delta n(t)/n = A F f_0 V(t) \qquad \text{Equation 1}$$

where: $f_0$ is an oscillation frequency of the laser 100; and
F is a filling factor corresponding to a fraction of an effective cavity length occupied by the index-changing medium, which includes the phase region 114 that has a wider band gap compared to the gain region 108 and is nominally transparent at the oscillation frequency $f_0$.

Thus, with a small adjustment of the magnitude of the bias voltage $V_{BIAS}$, a frequency range of between zero and two hundred GHz can be achieved by the laser 100. As a result, the laser 100 can transmit at least four bits of information by splitting the full frequency range into intervals corresponding to each of a plurality of different multi-bit digital codes.

It is to be understood that the laser 100 is not intended to be limited to the example of FIG. 3. For example, while the laser 100 is described herein as being a VCSEL, it is to be understood that any of a variety of other lasers can be implemented for generating and modulating the FSK optical signal $OPT_{FSK}$. In addition, the structure of the laser 100 is not limited to the first and second reflectors 104 and 106, the gain region 108, the spacer 110, and the phase region 114, but other arrangements of these and other layers are also possible. Accordingly, the laser 100 can be arranged in a variety of ways.

Figure 4:
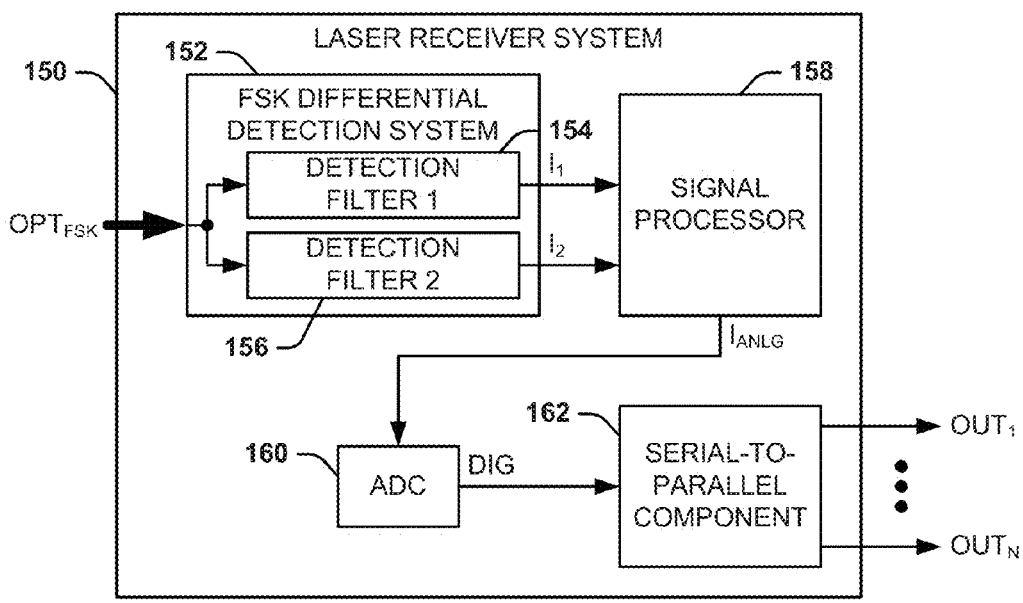
FIG. 4 illustrates an example of a laser receiver system.

FIG. 4 illustrates an example of a laser receiver system 150. The laser receiver system 150 can correspond to the laser receiver system 14 in the example of FIG. 1. Therefore, reference is to be made to the example of FIG. 4 in the following description of the example of FIG. 4.

The laser receiver system 150 includes an FSK differential detection system 152. The FSK differential detection system 152 includes a first detection filter 154 and a second detection filter 156. The FSK optical signal $OPT_{FSK}$ is directed to each of the first and second detection filters 154 and 156. As an example, the first and second detection filters 154 and 156 can be configured substantially similar, except with respect to a resonant cavity length that can be unique. Each of the first and second detection filters 154 and 156 can include a photodetector that is configured to generate a current $I_1$ and a current $I_2$ that corresponds to the intensity of the FSK optical signal $OPT_{FSK}$ resonating in each of the respective first and second detection filters 154 and 156. Based on the difference in resonating cavity length in each of the first and second detection filters 154 and 156, the currents $I_1$ and $I_2$ can have different magnitudes. For example, the magnitudes of the currents $I_1$ and $I_2$ can correspond to the frequency of the FSK optical signal $OPT_{FSK}$ relative to the resonating cavity length of the respective first and second detection filters 154 and 156. Accordingly, a mathematical relationship between the currents $I_1$ and $I_2$ can be indicative of the frequency of the FSK optical signal $OPT_{FSK}$.

The currents $I_1$ and $I_2$ are provided to a signal processor 158. The signal processor 158 can be configured to generate an analog current $I_{ANLG}$ that corresponds to a mathematical relationship between the currents $I_1$ and $I_2$. As an example, the signal processor 158 can be configured to calculate the analog current $I_{ANLG}$ based a difference between the currents $I_1$ and $I_2$ divided by a sum of the currents $I_1$ and $I_2$. For example, such a mathematical relationship can eliminate variations that can occur based on insertion losses of the FSK optical signal $OPT_{FSK}$ into the first and second detection filters 154 and 156 and spurious amplitude modulation of the FSK optical signal $OPT_{FSK}$ that can affect signal-to-noise ratio (SNR). Thus, the mathematical relationship of the currents $I_1$ and $I_2$, and thus the magnitude of the analog current $I_{ANLG}$, can be indicative of the frequency of the FSK optical signal $OPT_{FSK}$ based on a known differential offset in the resonating cavity lengths of the respective first and second detection filters 154 and 156.

The analog current $I_{ANLG}$ can be provided to an analog-to-digital converter (ADC) 160 that is configured to convert the analog current $I_{ANLG}$ to a digital value DIG. As an example, the digital value DIG can correspond to the multi-bit digital code encoded in the FSK optical signal $OPT_{FSK}$. The digital value DIG is thus provided to a serial-to-parallel component 162 that is configured to assign each bit of the multi-bit digital code to a respective one of the output signals $OUT_1$ through $OUT_N$. As an example, each of the output signals $OUT_1$ through $OUT_N$ can correspond to separate digital data streams that correspond to the digital data streams associated with the data signal DATA in the examples of FIGS. 1 and 2. Accordingly, the demodulation of the FSK optical signal $OPT_{FSK}$ into the separate digital data streams associated with the output signals $OUT_1$ through $OUT_N$ can result in very high bit rate communication, such as for use in optical interconnect systems.

Figure 5:
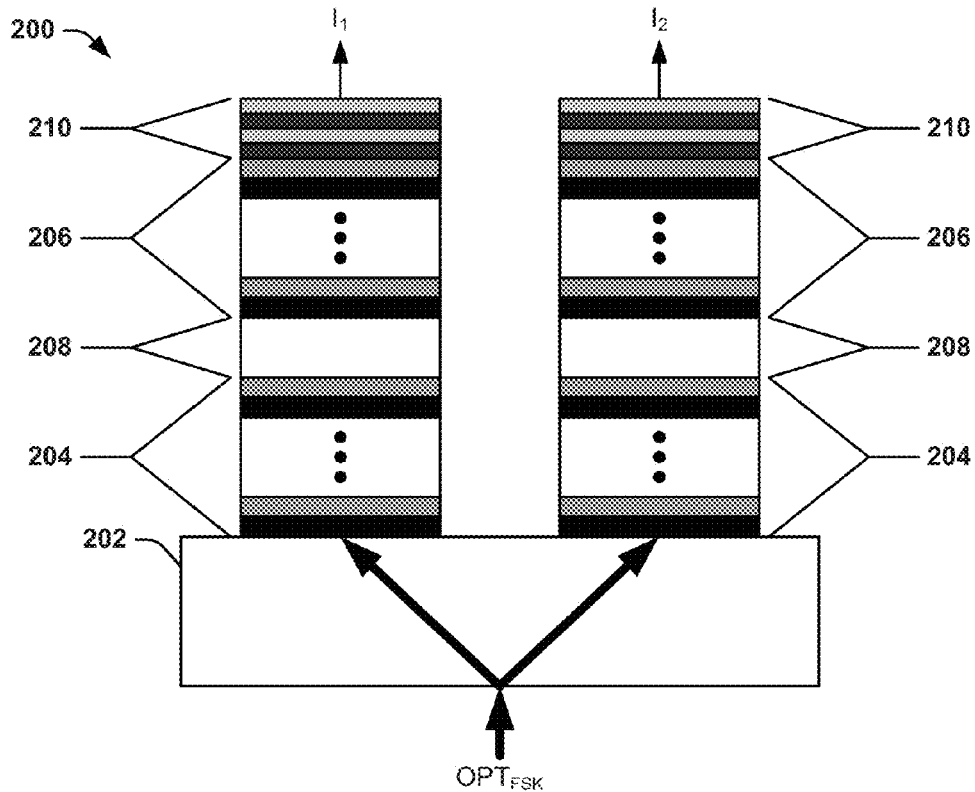
FIG. 5 illustrates an example of a frequency-shift keying (FSK) differential detection system.

FIG. 5 illustrates an example of an FSK differential detection system 200. The FSK differential detection system 200 can correspond to the FSK differential detection systems 18 and 152 in the respective examples of FIGS. 1 and 4. Therefore, reference is to be made to the examples of FIGS. 1 and 4 in the following description of the example of FIG. 5.

The FSK differential detection system 200 includes a substrate 202 on which the FSK differential detection system 200 can be fabricated. For example, the substrate 202 can be configured as a semiconductor material, such as gallium-arsenide (GaAs). The FSK differential detection system 200 also includes a first differential detection filter 204 and a second differential detection filter 206. The first and second differential detection filters 204 and 206 can each be configured substantially similarly.

In the example of FIG. 5, each of the first and second differential detection filters 204 and 206 include a first reflector portion 208 and a second reflector portion 210. The first and second reflector portions 208 are each configured as distributed Bragg reflectors having alternating material layers. The alternating material layers of the first and second reflector portions 208 and 210 can be fabricated on the FSK differential detection system 200 in any of a variety of ways, such as MBE or MOCVD. As an example, the first and second reflector portions 208 and 210 can include alternating layers of N-doped aluminum-gallium-arsenide (AlGaAs) in respective ratios of $Al_{0.9}Ga_{0.1}As$ and $Al_{0.1}Ga_{0.9}As$, with each layer having a thickness that is approximately one quarter of nominal wavelength (e.g., 980 nm). For example, the first and second reflector portions 208 and 210 can each have approximately ten pairs of alternating layers. Accordingly, the first and second reflector portions 208 and 210 can define a Fabry-Perot resonating cavity, such that the FSK optical signal $OPT_{FSK}$ can be provided to both the first and second differential detection filters 204 and 206, such as via a sub-wavelength grating formed on the substrate 202, and can resonate within the first and second differential detection filters 204 and 206.

The first and second differential detection filters 204 and 206 also each include a resonator cavity 212. As an example, the resonator cavity 212 in each of the first and second differential detection filters 204 and 206 can be fabricated from AlGaAs (e.g., in a ratio of $Al_{0.1}Ga_{0.9}As$). However, the length of the resonator cavity 212 in each of the first and second differential detection filters 204 and 206 can be different with respect to each other. As an example, the length of the resonator cavity 212 associated with the first differential detection filter 204 can be approximately 0.999 times the nominal wavelength, and the length of the resonator cavity 212 associated with the second differential detection filter 206 can be approximately 1.001 times the nominal wavelength. Therefore, the transmission spectra of the first and second differential detection filters 204 and 206 can be shifted relative to each other.

The first and second differential detection filters 204 and 206 also each include a photodetector region 214. The photodetector region 214 can include a plurality of quantum wells that are separated by a similar plurality of strain-balancing barrier layers. The quantum wells can include, for example, InGaAs (e.g., in a ratio of $In_{0.25}Ga_{0.75}As$) and the strain-balancing barrier layers can include, for example, GaAsP (e.g., in a ratio of $GaAs_{0.9}P_{0.1}$). The photodetector region 214 of the first and second differential detection filters 204 and 206 can thus be configured to generate respective currents $I_1$ and $I_2$ associated with the intensity of the FSK optical signal $OPT_{FSK}$ resonating therein. Because the resonant cavities 212 of the first and second differential detection filters 204 and 206 have different lengths relative to each other, the currents $I_1$ and $I_2$ can each have magnitudes that are associated with the frequency of the FSK optical signal $OPT_{FSK}$ relative to the length of the respective resonator cavities 212. Accordingly, based on the known differential offset in the lengths of the resonator cavities 212 of the respective first and second differential detection filters 204 and 206, the currents $I_1$ and $I_2$ can thus collectively correspond to the frequency of the FSK optical signal $OPT_{FSK}$.

Figure 6:
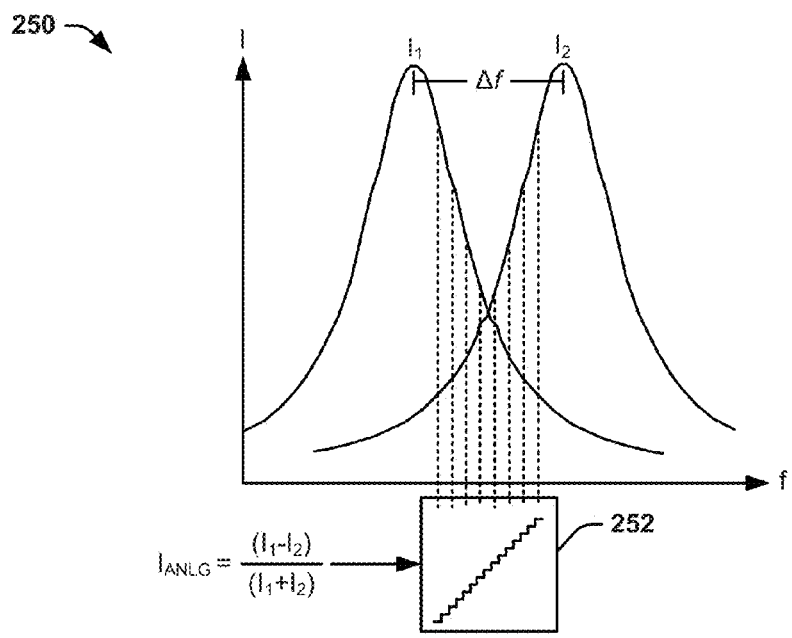
FIG. 6 illustrates an example of a graph of current versus frequency.

FIG. 6 illustrates an example of a graph 250 of current versus frequency. In the example of FIG. 6, the graph 250 plots the currents $I_1$ and $I_2$ versus the frequency of the FSK optical signal $OPT_{FSK}$. As demonstrated in the example of FIG. 6, the currents $I_1$ and $I_2$ have peaks that are offset by a known frequency $\Delta f$ based on the difference between the lengths of the resonator cavities 212 in each of the first and second differential detection filters 204 and 206. As described above in the example of FIG. 4, the signal processor 158 is configured to calculate the analog current $I_{ANLG}$ that corresponds to the frequency of the FSK optical signal $OPT_{FSK}$, and thus the multi-bit digital code encoded therein, based on a mathematical relationship between the currents $I_1$ and $I_2$. In the example of FIG. 6, the mathematical relationship is expressed as follows:

$$I_{ANLG}=(I_1-I_2)/(I_1+I_2) \quad \text{Equation 2}$$

Therefore, the resulting magnitude of the analog current $I_{ANLG}$ can resemble a step-function, demonstrated in the example of FIG. 6 at 252, with each step corresponding to a separate frequency interval of the FSK optical signal $OPT_{FSK}$. Accordingly, each step of the step-function can correspond to a separate multi-bit digital code encoded within the FSK optical signal $OPT_{FSK}$. It is to be understood that the step-function at 252 is demonstrated in discrete steps in the example of FIG. 6 for simplicity, but that the actual analog current $I_{ANLG}$ may not be as defined and/or may require filtering to achieve such discrete steps.

Figure 7:
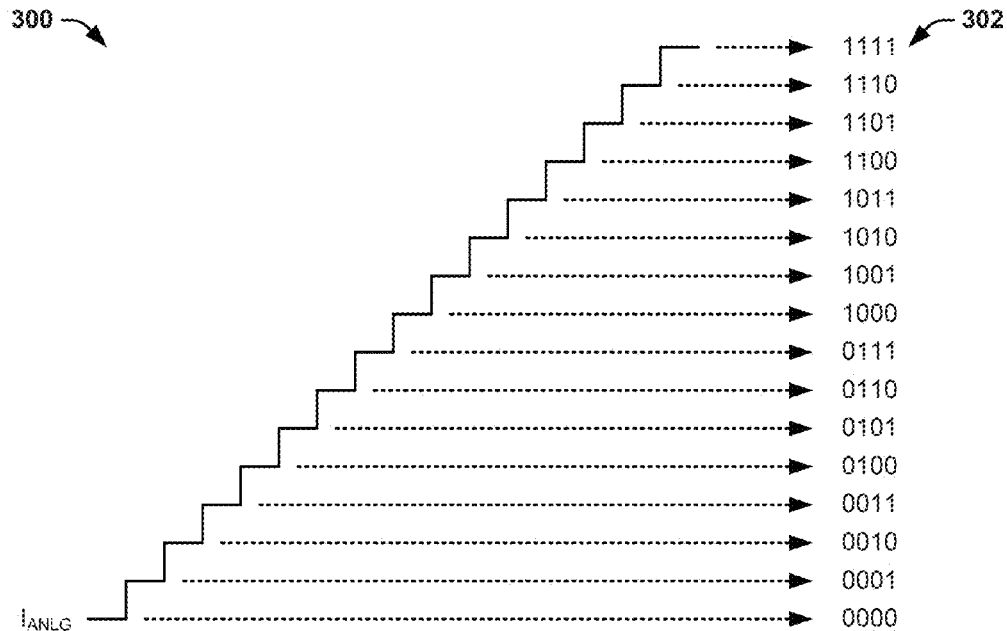
FIG. 7 illustrates an example of an encoding scheme.

FIG. 7 illustrates an example diagram 300 of an encoding scheme. The encoding scheme of the diagram 300 can correspond to a multi-bit digital code associated with the step-function demonstrated at 252 in the example of FIG. 6. In the example of FIG. 7, each of sixteen discrete steps of the step-function associated with the analog current $I_{ANLG}$ can be associated with a respective one of sixteen different four bit digital codes, demonstrated at 302. Therefore, the diagram 300 demonstrates that each discrete magnitude of the analog current $I_{ANLG}$ can be associated with a separate frequency interval of the FSK optical signal $OPT_{FSK}$, and that each such discrete magnitude of the analog current $I_{ANLG}$ is associated with a separate digital code encoded therein. As described in the example of FIG. 4, the ADC 160 can thus convert the magnitude of the analog current $I_{ANLG}$ into the respective one of the multi-bit digital codes. The serial-to-parallel component 162 can thus assign each bit of the multi-bit code to a respective one of the plurality of outputs $OUT_1$ through $OUT_N$. Accordingly, in the example of FIG. 7, the serial-to-parallel component 162 can provide the four bit digital code to each of four outputs $OUT_1$ through $OUT_4$, such that the FSK optical signal $OPT_{FSK}$ can provide a data rate of 40 Gbps for four separate data bit streams of 10 Gbps each.

It is to be understood that the laser receiver system 150, the FSK differential detection system 200, the graph 250, and the diagram 300 are not intended to be limited to the respective examples of FIGS. 4-7. As an example, while the FSK differential detection systems 152 and 200 each include two differential detection filters, it is to be understood that additional differential detection filters, each with unique resonator cavity lengths, can be implemented. As another example, while the examples of FIG. 7 demonstrates a four bit digital code, more or less bits can be encoded into the FSK optical signal $OPT_{FSK}$, such as can increase or decrease the data rate of the FSK optical signal $OPT_{FSK}$.

Figure 8:
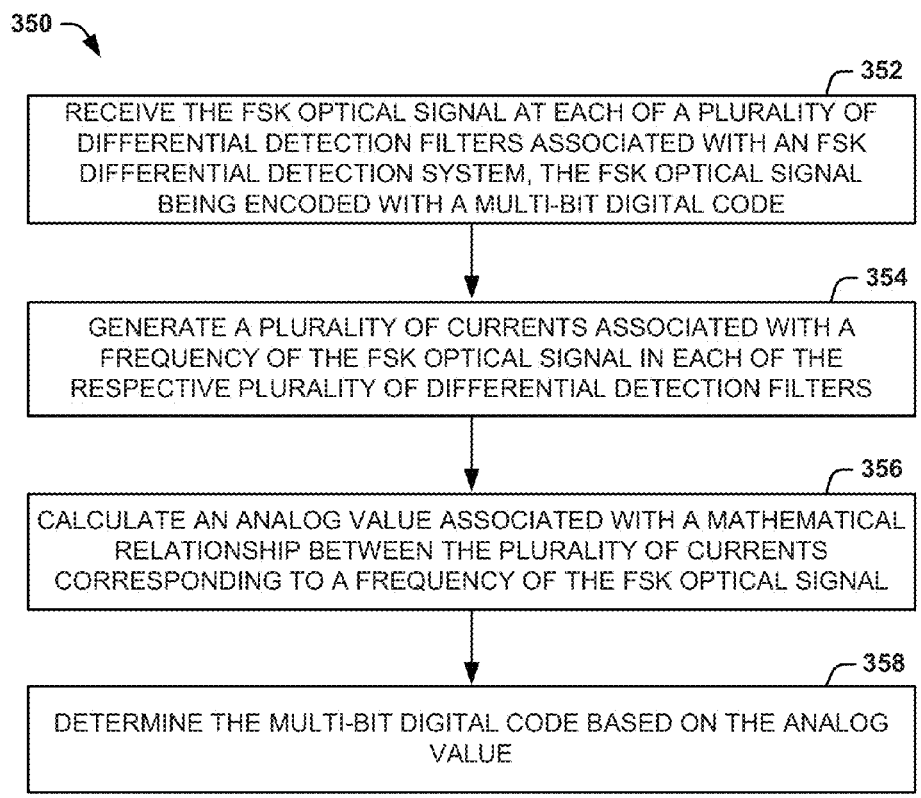
FIG. 8 illustrates an example method for demodulating.

In view of the foregoing structural and functional features described above, an example method will be better appreciated with reference to FIG. 8. While, for purposes of simplicity of explanation, the method of FIG. 8 is shown and described as executing serially, it is to be understood and appreciated that the method is not limited by the illustrated order, as parts of the method could occur in different orders and/or concurrently from that shown and described herein.

FIG. 8 illustrates an example of a method 350 for demodulating. At 352, an FSK optical signal (e.g., the FSK optical signal $OPT_{FSK}$) is received at each of a plurality of differential detection filters (e.g., the differential detection filters 154 and 156) associated with an FSK differential detection system (e.g., the FSK differential detection system 152), the FSK optical signal being encoded with a multi-bit digital code (e.g., the digital value DIG). At 354, a plurality of currents (e.g., the currents $I_1$ and $I_2$) associated with a frequency of the FSK optical signal in each of the respective plurality of differential detection filters are generated. At 356, an analog value (e.g., the analog current $I_{ANLG}$) associated with a mathematical relationship between the plurality of currents corresponding to a frequency of the FSK optical signal is calculated. At 358, the multi-bit digital code is determined based on the analog value.

What have been described above are examples. It is, of course, not possible to describe every conceivable combination of components or methodologies, but one of ordinary skill in the art will recognize that many further combinations and permutations are possible. Accordingly, the invention is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A laser communication system comprising a laser receiver system to receive a frequency-shift keyed (FSK) optical signal encoded with a plurality of data signals, the laser receiver system comprising:
    an FSK differential detection system that comprises a plurality of differential detection filters that are each to receive the FSK optical signal and to generate an output;
    a signal processor to demodulate the FSK optical signal into an analog signal having a magnitude corresponding to a frequency of the FSK optical signal based on the relative output of each of the plurality of differential detection filters with respect to each other; and
    an analog-to-digital converter (ADC) to convert the magnitude of the analog signal to a multi-bit code.

2. A laser communication system comprising a laser receiver system to receive a frequency-shift keyed (FSK) optical signal encoded with a plurality of data signals, the laser receiver system comprising:
    an FSK differential detection system that comprises a plurality of differential detection filters that are each to receive the FSK optical signal and to generate an output, the FSK differential detection system to demodulate the FSK optical signal into a multi-bit digital code corresponding to a frequency of the FSK optical signal based on the output of each of the plurality of differential detection filters; and
    wherein the FSK differential detection system is to generate a plurality of currents corresponding to the respective plurality of differential detection filters, the laser receiver system to generate the multi-bit digital code corresponding to the plurality of data signals based on a mathematical relationship of the plurality of currents.

3. The system of claim 1, wherein the plurality of differential detection filters comprises a pair of differential detection filters to receive the FSK optical signal, each of the pair of differential detection filters comprising:
- a plurality of reflecting portions to resonate the FSK optical signal;
- a resonator cavity within which the FSK optical signal resonates, the resonator cavity of each of the pair of differential detection filters having a unique resonator cavity length; and
- a photodetector to generate a current corresponding to a frequency of the FSK optical signal relative to the unique cavity length, the current corresponding to the output of the respective one of the pair of differential detection filters.

4. The system of claim 3, wherein the laser receiver system is to generate the multi-bit digital code corresponding to the plurality of data signals based on a difference of the current associated with each of the pair of differential detection filters divided by a sum of associated with each of the pair of differential detection filters.

5. The system of claim 4, wherein the laser receiver system further comprises a serial-to-parallel component to convert the multi-bit digital code to the plurality of data signals.

6. The system of claim 1, further comprising a laser transmitter system to modulate a plurality of data signals into the FSK optical signal via an FSK modulated laser.

7. The system of claim 6, wherein the FSK modulated laser comprises:
- a gain section to generate the FSK optical signal in response to a bias voltage;
- a plurality of reflecting portions to resonate the FSK optical signal; and
- a phase section to modulate a frequency associated with the FSK optical signal in response to a modulation voltage that varies to adjust a refractive index of the phase section.

8. The system of claim 6, wherein the FSK modulated laser is a vertical-cavity surface-emitting laser (VCSEL).

9. An optical interconnect system comprising the laser communication system of claim 1.

10. A method for demodulating, the method comprising:
- receiving a frequency-shift keyed (FSK) optical signal at each of a plurality of differential detection filters associated with an FSK differential detection system, the FSK optical signal being encoded with a multi-bit digital code;
- generating a plurality of currents based on a frequency of the FSK optical signal in each of the respective plurality of differential detection filters;
- calculating an analog value associated with a mathematical relationship between the plurality of currents corresponding to a frequency of the FSK optical signal; and
- determining the multi-bit digital code based on the analog value.

11. The method of claim 10, wherein the plurality of differential detection filters comprises a pair of differential detection filters, and wherein resonating the FSK optical signal comprises resonating the FSK optical signal in each of the pair of differential detection filters having a unique resonator cavity length relative to each other, and wherein generating the plurality of currents comprises generating a pair of currents associated with a frequency of the FSK optical signal relative to the unique resonator cavity length associated with each of the respective pair of differential detection filters.

12. The method of claim 10, wherein calculating the analog value comprises calculating the analog value based on a difference of the plurality of currents divided by a sum of the plurality of currents.

13. The method of claim 10, further comprising converting the multi-bit digital code into a plurality of single-bit digital codes, each of the single-bit digital codes being associated with a separate one of a plurality of bit-streams.

14. A laser communication system comprising:
- a laser transmitter system comprising:
  - a digital-to-analog converter (DAC) to convert a plurality of data signals into an analog value; and
  - a laser to modulate the plurality of data signals into a frequency-shift keyed (FSK) optical signal based on the analog value; and
- a laser receiver system comprising:
  - an FSK differential detection system comprising a pair of differential detection filters that are each to receive the FSK optical signal and to generate an output current corresponding to a frequency of the FSK optical signal;
  - a signal processor to generate an analog signal associated with a mathematical relationship between the output current of each of the pair of differential detection filters corresponding to a frequency of the FSK optical signal; and
  - an analog-to-digital converter (ADC) to convert the analog signal to a multi-bit digital code corresponding to the plurality of data signals.

15. The system of claim 14, wherein each of the pair of differential detection filters comprises:
- a plurality of reflecting portions to resonate the FSK optical signal;
- a resonator cavity within which the FSK optical signal resonates, the resonator cavity of each of the pair of differential detection filters having a unique resonator cavity length; and
- a photodetector to generate the output current based on the frequency of the FSK optical signal relative to the unique resonator cavity length.

16. The system of claim 14, wherein the FSK modulated laser comprises:
- a gain section to generate the FSK optical signal in response to a bias voltage;
- a plurality of reflecting portions to resonate the FSK optical signal; and
- a phase section to modulate a frequency associated with the FSK optical signal in response to a modulation voltage that varies based on the analog value to adjust a refractive index of the phase section.

\* \* \* \* \*